US007376414B2

(12) United States Patent
Engstrom

(10) Patent No.: US 7,376,414 B2
(45) Date of Patent: May 20, 2008

(54) METHOD AND SYSTEM FOR INSERTING ADVERTISEMENTS INTO BROADCAST CONTENT

(75) Inventor: G. Eric Engstrom, Kirkland, WA (US)

(73) Assignee: Varia Mobil LLC, Seattle, WA (US)

( * ) Notice: Subject to any disclaimer, the term of this patent is extended or adjusted under 35 U.S.C. 154(b) by 587 days.

(21) Appl. No.: 10/143,342

(22) Filed: May 10, 2002

(65) Prior Publication Data

US 2002/0169540 A1 Nov. 14, 2002

Related U.S. Application Data

(60) Provisional application No. 60/290,592, filed on May 11, 2001.

(51) Int. Cl.
| H04L 12/58 | (2006.01) |
| H04M 3/00 | (2006.01) |
| H04Q 7/20 | (2006.01) |
| H04N 7/10 | (2006.01) |
| G06F 3/00 | (2006.01) |

(52) U.S. Cl. .............. 455/414.3; 455/412.1; 455/420; 455/456.3; 725/34; 725/42

(58) Field of Classification Search ............ 455/456.3, 455/412.1, 420, 414.3; 725/34, 42
See application file for complete search history.

(56) References Cited

U.S. PATENT DOCUMENTS

| 5,689,799 | A * | 11/1997 | Dougherty et al. ........ 455/2.01 |
| 6,163,683 | A * | 12/2000 | Dunn et al. .............. 455/151.1 |
| 6,226,444 | B1 * | 5/2001 | Goldschmidt Iki et al. ... 386/83 |
| 6,507,764 | B1 * | 1/2003 | Parrella et al. ............... 700/94 |
| 6,526,335 | B1 * | 2/2003 | Treyz et al. .................... 701/1 |
| 6,587,127 | B1 * | 7/2003 | Leeke et al. ................ 715/765 |
| 6,587,835 | B1 * | 7/2003 | Treyz et al. ................... 705/14 |
| 6,600,908 | B1 * | 7/2003 | Chan ........................ 455/150.1 |
| 6,647,257 | B2 * | 11/2003 | Owensby ................. 455/414.1 |
| 6,698,020 | B1 * | 2/2004 | Zigmond et al. ............. 725/34 |
| 6,813,501 | B2 * | 11/2004 | Kinnunen et al. ........ 455/456.2 |
| 6,823,225 | B1 * | 11/2004 | Sass ........................... 700/94 |
| 6,950,623 | B2 * | 9/2005 | Brown et al. .............. 455/3.01 |
| 6,952,559 | B2 * | 10/2005 | Bates et al. ................ 455/3.06 |
| 7,003,478 | B1 * | 2/2006 | Choi ........................... 705/14 |
| 7,006,807 | B2 * | 2/2006 | Szczublewski et al. ..... 455/227 |
| 2001/0037240 | A1 * | 11/2001 | Marks et al. ................. 705/14 |

(Continued)

Primary Examiner—Fan Tsang
Assistant Examiner—Lisa Hashem
(74) Attorney, Agent, or Firm—Schwabe, Williamson & Wyatt, P.C.

(57) ABSTRACT

The present invention is directed to providing advertisements for playing on a mobile device based on previously provided information regarding the mobile device user. Information regarding the user is provided to a server, which is also in communication with advertisers that supply advertisements for playing on the mobile device. The server employs the user information to determine which advertisements might be suitable for the mobile device user. The determined advertisements may be cached/recorded on the mobile device for later playback or they can be provided in real time at a scheduled time for the playing of advertisements. Also, advertisements associated/included with the currently playing content could be suppressed in favor of the determined advertisements. Additionally, the currently playing content can be recorded while advertisements are playing on the mobile device; and then the playing of the content can be subsequently resumed from the point where the advertisements started playing.

14 Claims, 9 Drawing Sheets

U.S. PATENT DOCUMENTS

2002/0077083 A1* 6/2002 Zellner et al. .............. 455/414
2002/0107027 A1* 8/2002 O'Neil ....................... 455/456
2005/0215238 A1* 9/2005 Macaluso ................ 455/414.1
2005/0239448 A1* 10/2005 Bayne .................... 455/414.3
2007/0099701 A1* 5/2007 Simon et al. ................. 463/40
2007/0124762 A1* 5/2007 Chickering et al. ........... 725/35
2007/0184820 A1* 8/2007 Marshall .................. 455/414.3
2007/0283384 A1* 12/2007 Haeuser et al. ............... 725/34

* cited by examiner

METHOD AND SYSTEM FOR INSERTING ADVERTISEMENTS INTO BROADCAST CONTENT

CROSS REFERENCE TO RELATED APPLICATIONS

This utility application is related to a previously filed U.S. Provisional Application, Ser. No. 60/290,592, filed on May 11, 2001, the benefit of the earlier filing date of which is hereby claimed under 35 U.S.C. §119(e).

FIELD OF THE INVENTION

The present invention is related to mobile telecommunication devices, and more specifically to inserting advertisements into broadcast content played on a mobile device.

BACKGROUND OF THE INVENTION

Since their introduction, the number of services and features for cellular telephones has steadily increased. At first, these mobile devices operated on analog wireless networks that enabled voice communication and simple paging features. Later, digital wireless networks for cellular telephones were implemented to provide more advanced features for voice and data communication, such as encryption, caller identification and short message service (SMS) text messages. More recently, some cellular telephones enable the browsing of web pages on the Internet, tuning to radio stations, playing streamed content, or other on-line services.

The functionality of cellular telephones has continued to increase and incorporate many of the features originally provided for in handheld electronic devices such as personal digital assistants (PDAs). Relatively simple PDA features such as keeping a list of contacts, a calendar, appointments, and the like have been generally integrated into recent cellular telephone models. Also, more advanced features are becoming more widely available such as playing streamed content and broadcasts. In the past, providers of streamed content/broadcasts have not been able to differentiate advertisements for cellular telephone users versus other types of users. Typically, advertisements included with the streamed content/broadcasts were more generically directed to the demographics of a typical viewer, not the particular user viewing the playing of streamed content/broadcasts.

SUMMARY OF THE INVENTION

The present invention is directed to a method for playing content and advertisements on a mobile device. A mobile device provides information associated with a user of the mobile device. The provided information is employed to determine at least one advertisement to be played on the mobile device. If a determined time interval occurs, the playing of content by the mobile device is stopped while at least one determined advertisement is played on. The playing of content by the mobile device is resumed when the playing of the determined advertisement is finished.

Another aspect of the invention is directed to providing information associated with the mobile device user including at least a selected one of geographic location, preference, demographic, other source, behavior and content played on the mobile device.

Yet another aspect of the invention is directed to recording content while at least one determined advertisement is playing. And when the playing of at least one determined advertisement is completed, resuming the playing of content from where the stopping of the playing of the content occurred.

Still another aspect of the invention is directed to providing at least one determined advertisement to the mobile device prior to playing. And recording at least one determined advertisement on the mobile device for play back later, i.e., when the determined interval occurs.

Another aspect of the invention is directed to employing at least one determined advertisement as a replacement for an advertisement associated with the content. And playing the replacement on the mobile device instead of the advertisement associated with the content.

Yet another aspect of the invention is directed to receiving a stream of content and/or a broadcast of content for playing on the mobile device.

Still another aspect of the invention is directed to receiving a stream and/or broadcast for at least one determined advertisement.

Yet another aspect of the invention is directed to playing determined advertisements with a mobile device in substantially the same way as the method discussed above. A further aspect of the invention is directed to playing determined advertisements with a client application on a mobile device that is in communication with a server application that is remotely located.

DETAILED DESCRIPTION OF THE PREFERRED EMBODIMENT

Figure 1:
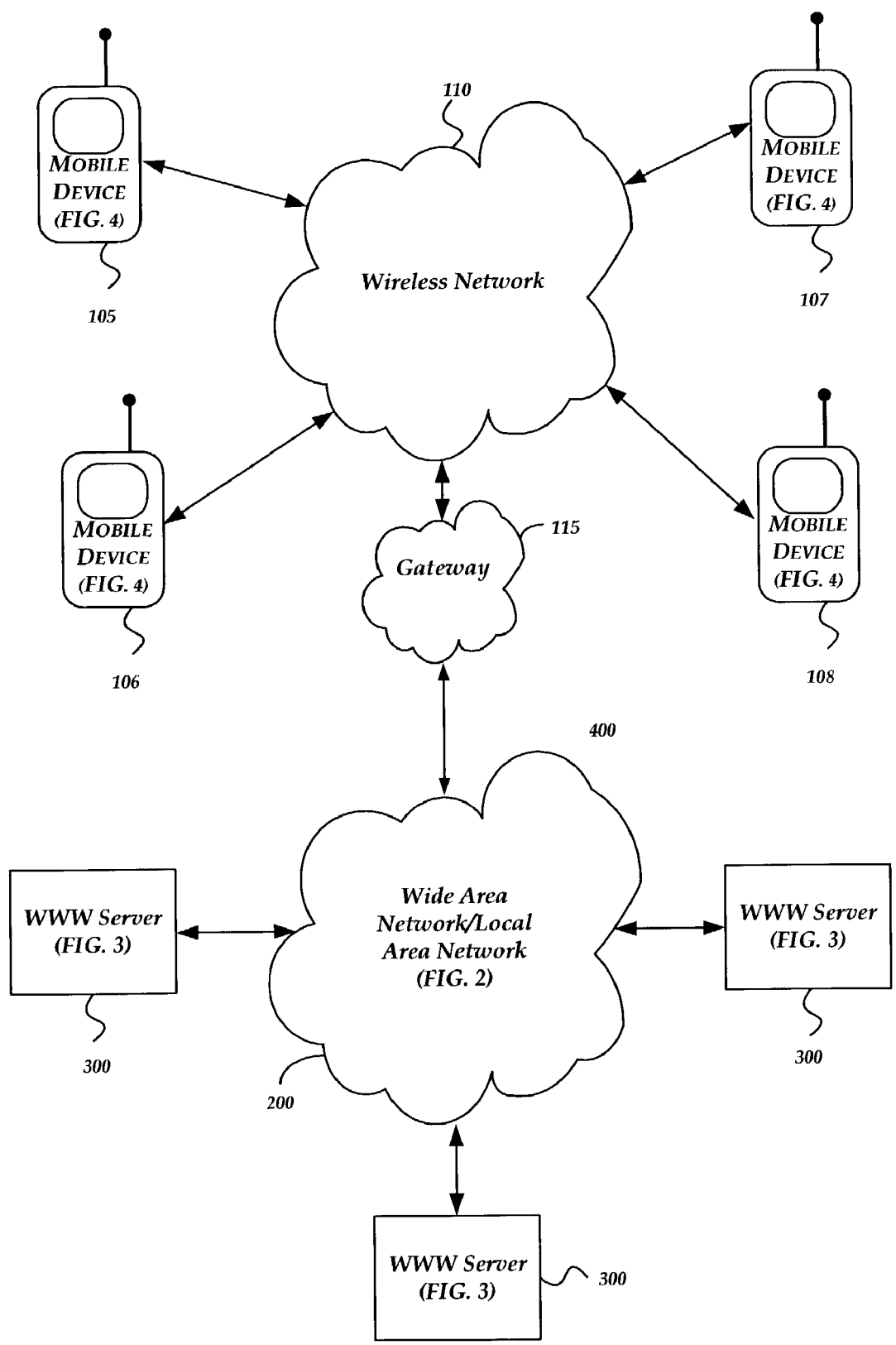
FIG. 1 illustrates a schematic diagram that shows an exemplary system overview.

In the following detailed description of exemplary embodiments of the invention, reference is made to the accompanied drawings, which form a part hereof, and which is shown by way of illustration, specific exemplary embodiments of which the invention may be practiced. Each embodiment is described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "a broadcast spectrum" means any portion or portions of the range of frequencies, channels, or Internet addresses employed for broadcasting that can be selected for tuning in conjunction with the practice of the invention disclosed herein. The term "broadcast" includes but is not limited to commercial and non-commercial radio and television stations, Internet radio and the like. The term "user preference" can include a plurality of elements. For example, a user preference for disco music circa 1980 has at least two elements, i.e., the type of music and the era.

The term "location" or "presence" includes anything on which a position of a user may be expressed, e.g., the physical, virtual and ordinal location of the user. The physical location may be determined in many ways, including, but not limited to, manual input from a user, Global Positioning System (GPS) information, Assisted GPS and wireless signal triangulation. The virtual location may be expressed including, but not limited to, the current page(s) being browsed and positions within multi-dimensional virtual environments or interactive multimedia presentations. Also, the ordinal location may be expressed as the location within including, but not limited to, user interface displays, and positions within streamed and/or broadcast content, such as song on a radio station or television show on a video channel.

The term "user interface" can include any type of element that is selectable on a mobile device, including, but not limited to, push-button, rocker switch, slider, dial, key, mouse, pointer, touch-sensitive pad, touch sensitive screen, and soft key.

The term "mobile device" or "mobile media player" includes any device capable of connecting to a wireless network. Such devices include cellular telephones, smart phones, pagers, radio frequency (RF) devices, infrared (IR) devices, citizen band radios (CBs), integrated devices combining one or more of the preceding devices, and the like. Mobile devices may also include other devices that have a wireless interface such as PDAs, handheld computers, personal computers, multiprocessor systems, microprocessor-based or programmable consumer electronics, network PCs, wearable computers, and the like.

Referring to the drawings, like numbers indicate like parts throughout the views. Additionally, a reference to the singular includes a reference to the plural unless otherwise stated or is inconsistent with the disclosure herein.

The present invention is directed to providing advertisements for playing on a mobile device based on previously provided information regarding the mobile device user. Information regarding the user is provided to a server, which is also in communication with advertisers that supply advertisements for playing on the mobile device. The server employs the user information to determine which advertisements might be suitable for the mobile device user. The determined advertisements may be cached/recorded on the mobile device for later playback or they could be provided in real time at a scheduled time for the playing of advertisements. Also, advertisements associated/included with the currently playing content could be suppressed in favor of the determined advertisements. Additionally, the currently playing content can be recorded while advertisements are playing on the mobile device; and then the playing of the content can be subsequently resumed from the point where the advertisements started playing.

Illustrative Operating Environment

With reference to FIG. 1, an exemplary system in which the invention operates includes wireless mobile devices 400, wireless network 110, gateway 115, wide area network (WAN)/local area network (LAN) 200 and one or more world wide web (WWW) servers 330.

Figure 4:
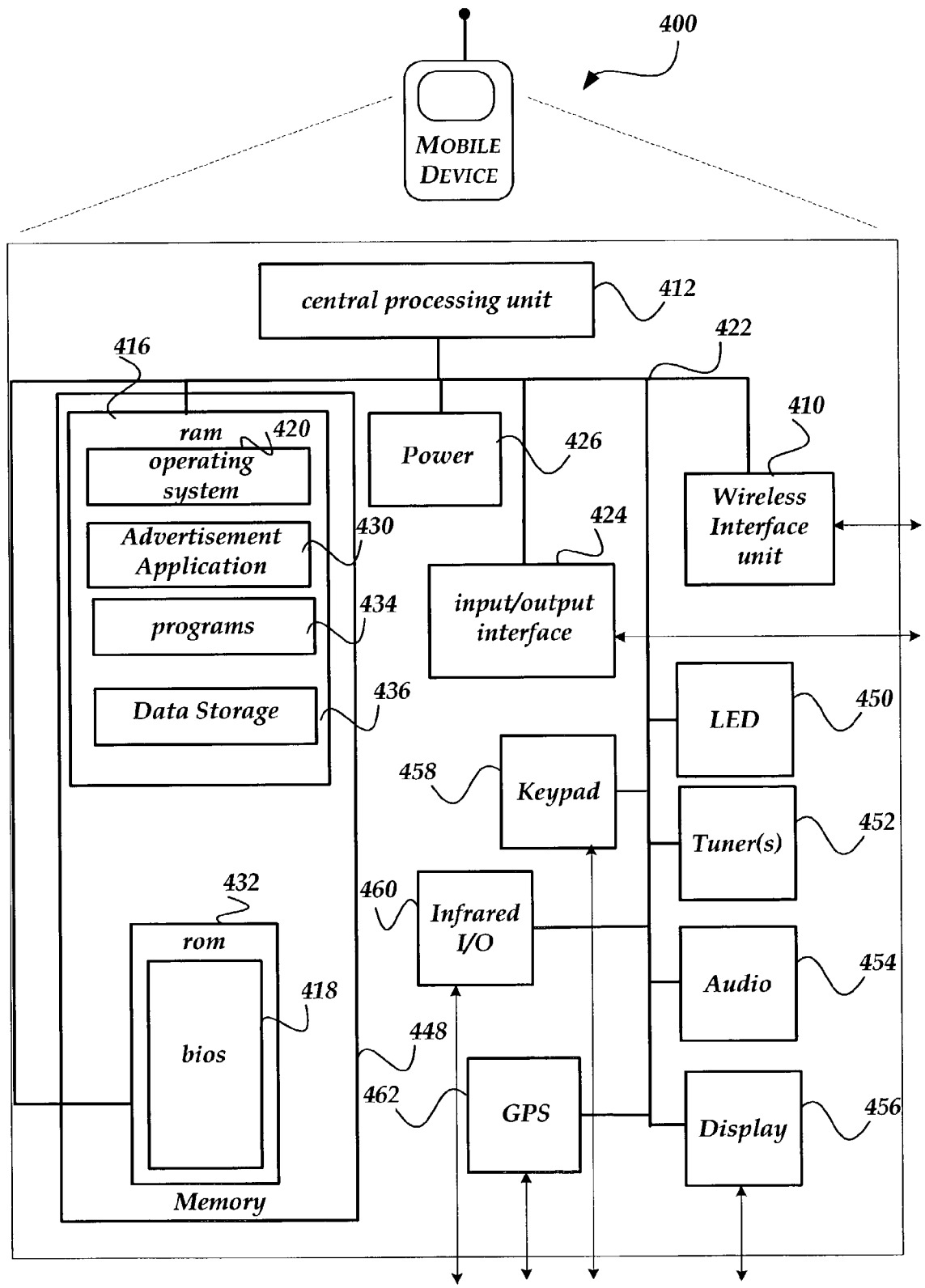
FIG. 4 shows a schematic diagram that illustrates an exemplary mobile device that is operative to play media.

Mobile devices 400 are coupled to wireless network 110 and are described in more detail in conjunction with FIG. 4. Wireless network 110 transports information to and from devices capable of wireless communication, such as mobile devices 400. Wireless network 110 may include both wireless and wired components. For example, wireless network 110 may include a cellular tower that is linked to a wired telephone network. Typically, the cellular tower carries communication to and from cell phones, pagers, and other wireless devices, and the wired telephone network carries communication to regular phones, long-distance communication links, and the like.

Wireless network 110 is coupled to WAN/LAN through gateway 115. Gateway 115 routes information between wireless network 110 and WAN/LAN 200. For example, a user using a wireless device may browse the Internet by calling a certain number or tuning to a particular frequency. Upon receipt of the number, wireless network 110 is configured to pass information between the wireless device and gateway 115. Gateway 115 may translate requests for web pages from wireless devices to hypertext transfer protocol (HTTP) messages, which may then be sent to WAN/LAN 200. Gateway 115 may then translate responses to such messages into a form compatible with the requesting device. Gateway 115 may also transform other messages sent from mobile devices 400 into information suitable for WAN/LAN 200, such as e-mail, audio, voice communication, contact databases, calendars, appointments, and the like.

Figure 2:
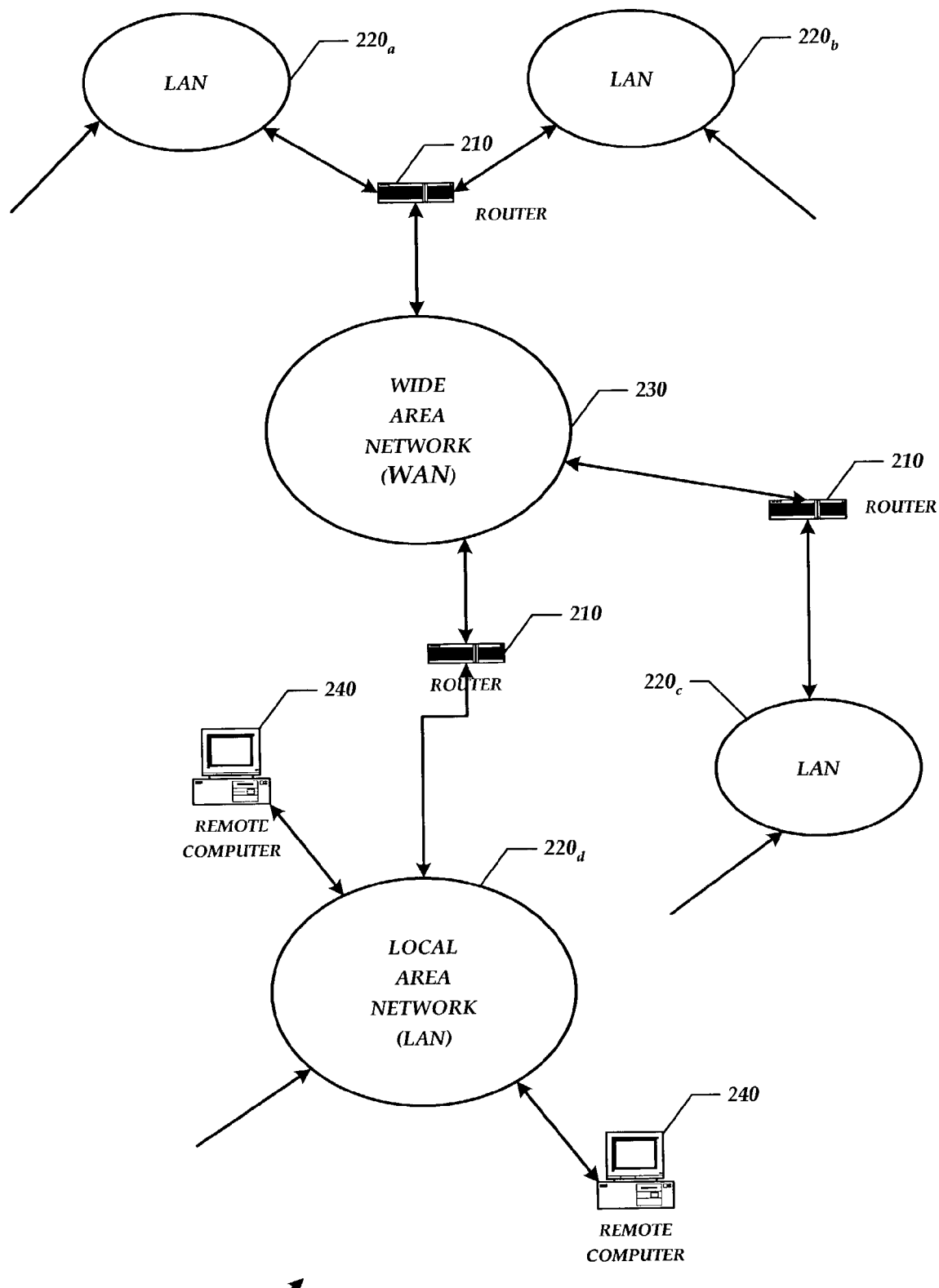
FIG. 2 shows a schematic diagram that illustrates an exemplary system overview in which local area networks and a wide area network are interconnected by routers.

Typically, WAN/LAN 200 transmits information between computing devices as described in more detail in conjunction with FIG. 2. One example of a WAN is the Internet, which connects millions of computers over a host of gateways, routers, switches, hubs, and the like. An example of a LAN is a network used to connect computers in a single office. A WAN may connect multiple LANS.

WWW servers 330 are coupled to WAN/LAN 200 through communication mediums. WWW servers 330 provide access to information and services as described in more detail in conjunction with FIG. 3.

FIG. 2 shows another exemplary system in which the invention operates in which a number of local area networks ("LANs") $220_{a-d}$ and wide area network ("WAN") 230 interconnected by routers 210. Routers 210 are intermediary devices on a communications network that expedite message delivery. On a single network linking many computers through a mesh of possible connections, a router receives transmitted messages and forwards them to their correct destinations over available routes. On an interconnected set of LANs—including those based on differing architectures and protocols—, a router acts as a link between LANs, enabling messages to be sent from one to another. Communication links within LANs typically include twisted wire pair, fiber optics, or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links, or other communications links. Furthermore, computers, such as remote computer 240, and other related electronic devices can be remotely connected to either LANs 220$_{a-d}$ or WAN 230 via a modem and temporary telephone link. The number of WANs, LANs, and routers in FIG. 2 may be increased or decreased without departing from the spirit or scope of this invention. As such, it will be appreciated that the Internet itself may be formed from a vast number of such interconnected networks, computers, and routers and that an embodiment of the invention could be practiced over the Internet without departing from the spirit and scope of the invention.

The media used to transmit information in communication links as described above illustrates one type of computer-readable media, namely communication media. Generally, computer-readable media includes any media that can be accessed by a computing device. Computer-readable media may include computer storage media, communication media, or any combination thereof.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, communication media includes wired media such as twisted pair, coaxial cable, fiber optics, wave guides, and other wired media and wireless media such as acoustic, RF, infrared, and other wireless media.

The Internet has recently seen explosive growth by virtue of its ability to link computers located throughout the world. As the Internet has grown, so has the WWW. Generally, the WWW is the total set of interlinked hypertext documents residing on HTTP servers around the world. Documents on the WWW, called pages or Web pages, are typically written in HTML (Hypertext Markup Language) or some other markup language, identified by URLs (Uniform Resource Locators) that specify the particular machine and pathname by which a file can be accessed, and transmitted from server to end user using HTTP. Codes, called tags, embedded in an HTML document associate particular words and images in the document with URLs so that a user can access another file, which may literally be halfway around the world, at the press of a key or the click of a mouse. These files may contain text (in a variety of fonts and styles), graphics images, movie files, media clips, and sounds as well as Java applets, ActiveX controls, or other embedded software programs that execute when the user activates them. A user visiting a Web page also may be able to download files from an FTP site and send messages to other users via email by using links on the Web page.

Figure 3:
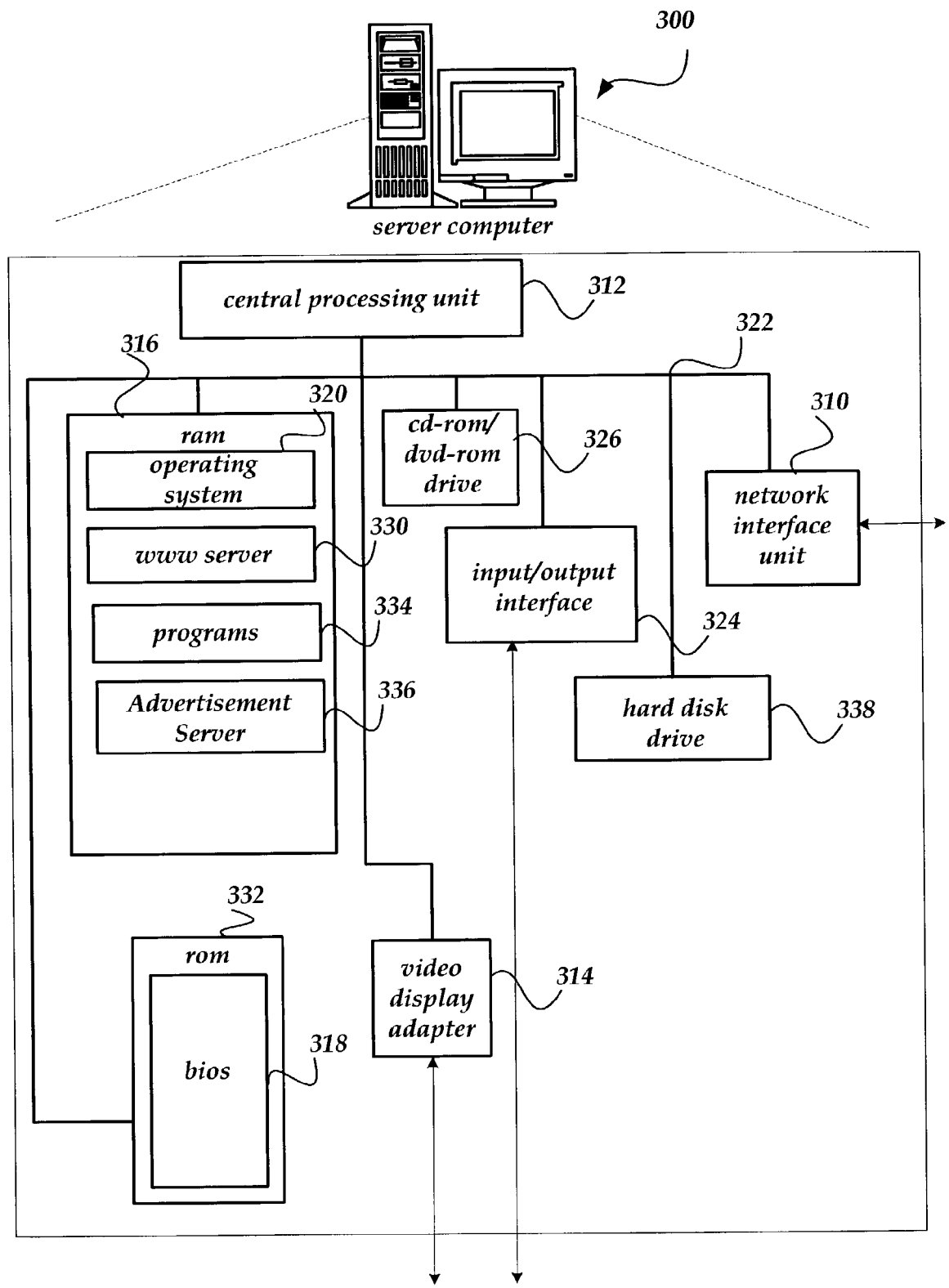
FIG. 3 illustrates a schematic diagram that shows an exemplary server computer.

A server computer, as described in more detail in conjunction with FIG. 3, is a computer connected to the Internet having storage facilities for storing hypertext documents for a WWW site and running administrative software for handling requests for the stored hypertext documents. A hypertext document normally includes a number of hyperlinks, i.e., highlighted portions of text which link the document to another hypertext document possibly stored at a WWW site elsewhere on the Internet. Each hyperlink is associated with a URL that provides the location of the linked document on a server connected to the Internet and describes the document. Thus, whenever a hypertext document is retrieved from a WWW server, the document is considered to be retrieved from the WWW. A WWW server may also include facilities for storing and transmitting application programs, such as application programs written in the JAVA programming language from Sun Microsystems, for execution on a remote computer. Likewise, a WWW server may also include facilities for executing scripts and other application programs on the WWW server itself.

A user may retrieve hypertext documents from the WWW via a WWW browser application program located on a wired or wireless device. A WWW browser, such as Netscape's NAVIGATOR® or Microsoft's INTERNET EXPLORER®, is a software application program for providing a graphical user interface to the WWW. Upon request from the user via the WWW browser, the WWW browser accesses and retrieves the desired hypertext document from the appropriate WWW server using the URL for the document and HTTP. HTTP is a higher-level protocol than TCP/IP and is designed specifically for the requirements of the WWW. HTTP is used to carry requests from a browser to a Web server and to transport pages from Web servers back to the requesting browser or client. The WWW browser may also retrieve application programs from the WWW server, such as JAVA applets, for execution on a client computer.

FIG. 3 shows an exemplary server computer 300 that includes WWW server 330 that is operative to provide a web site. Accordingly, WWW server 330 transmits web pages to a browser application program executing on requesting devices to carry out this process. For instance, WWW server 330 may transmit pages and forms for receiving information about a user, such as user preferences, address, telephone number, billing information, credit card numbers, and the like. Moreover, WWW server 330 may transmit WWW pages to a requesting device that allow a user to participate in a WWW site. The transactions may take place over the Internet, WAN/LAN 200, or some other communications network.

Those of ordinary skill in the art will appreciate that server computer 300 may include many more components than those shown in FIG. 3. However, the components shown are sufficient to disclose an illustrative embodiment for practicing the present invention. As shown in FIG. 3, server computer 300 is connected to WAN/LAN 200, or other communications network, via network interface unit 310. Those of ordinary skill in the art will appreciate that network interface unit 310 includes the necessary circuitry for connecting server computer 300 to WAN/LAN 200, and is constructed for use with various communication protocols including, but not limited to, the TCP/IP and WAP protocols.

Server computer 300 also includes processing unit 312, video display adapter 314, and a mass memory, all connected via bus 322. The mass memory generally includes RAM 316, ROM 332, and one or more permanent mass storage devices, such as hard disk drive 328, a tape drive, CD-ROM/DVD-ROM drive 326, and/or a floppy disk drive. The mass memory stores operating system 320 for controlling the operation of server computer 300. It will be appreciated that this component may comprise a general purpose server operating system as is known to those of ordinary skill in the art, such as UNIX, LINUX™, or Microsoft WINDOWS NT®. Basic input/output system ("BIOS") 318 is also provided for controlling the low-level operation of server computer 300.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data for providing a web site. More specifically, the mass memory stores applications including WWW server 330, programs 334, and advertisement server 336 (See figures and related discussion below). WWW server application 330 includes computer executable instructions which, when executed by server computer 300, generate WWW browser displays, including performing the logic described above. Server computer 300 may include other programs, including, but not limited to, a JAVA virtual machine, an SMTP handler application for transmitting and receiving email, an HTTP handler application for receiving and handing HTTP requests, JAVA applets for transmission to a WWW browser executing on a client computer, and an HTTPS handler application for handling secure connections. The HTTPS handler application may be used for communication with external security applications (not shown), to send and receive private information in a secure fashion.

Server computer 300 also includes input/output interface 324 for communicating with external devices, such as a mouse, keyboard, scanner, or other input devices not shown in FIG. 3. Likewise, server computer 300 may further include additional mass storage facilities such as CD-ROM/DVD-ROM drive 326 and hard disk drive 328. Hard disk drive 328 is utilized by server computer 300 to store, among other things, application programs, databases, and program data employed by WWW server application 330 and advertisement server 336.

FIG. 4 shows an exemplary mobile device 400, according to one embodiment of the invention. Mobile device 400 may be arranged to transmit and receive data. For instance, mobile device 400 may send and receive SMS text messages from other mobile devices (not shown) and servers (See FIG. 3 and related discussion) as well as receiving broadcasts. For example, mobile device 400 may receive radio broadcasts or television broadcasts. The data transmissions may take place over the Internet, WAN/LAN 200, or some other communications network.

Those of ordinary skill in the art will appreciate that mobile device 400 may include many more components than those shown in FIG. 4. However, the components shown are sufficient to disclose an illustrative embodiment for practicing the present invention. As shown in the figure, mobile device 400 includes processing unit 412, memory 448, RAM 416, ROM 432, operating system 420, advertisement application 430, programs 434, data storage 436, bios 418, power 426, input/output interface 424, wireless interface unit 410, LED 450, tuner(s) 452, audio 454, display 456, keypad 458, infrared input/output 460, and GPS interface 462.

Mobile device 400 may connect to WAN/LAN 200, or other communications network, via wireless interface unit 410. Those of ordinary skill in the art will appreciate that wireless interface unit 410 includes the necessary circuitry for connecting mobile device 400 to WAN/LAN 200, and is constructed for use with various communication protocols including the TCP/IP protocol. Wireless interface unit 410 may include a radio layer (not shown) that is arranged to transmit and receive radio frequency communications. Wireless interface unit 410 connects mobile device 400 to external devices, via a communications carrier or service provider.

Mass memory 448 generally includes RAM 416, ROM 432, and one or more data storage units 436. The mass memory stores operating system 420 for controlling the operation of mobile device 400. It will be appreciated that this component may comprise a general purpose server operating system as is known to those of ordinary skill in the art, such as a version of UNIX, LINUX™, or Microsoft WINDOWS®. Basic input/output system ("BIOS") 418 is also provided for controlling the low-level operation of mobile device 400.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data used within mobile device 400. More specifically, the mass memory stores applications including advertisement application 430, and programs 434. Programs 434 may include computer executable instructions which, when executed by mobile device 400, transmit and receive WWW pages, e-mail, audio, video, and the like. One or more programs 434 may be loaded into memory 448 and run under control of operating system 420. advertisement application 430 performs the methods described below. Examples of application programs include radio tuner programs, phone programs, communication programs, productivity programs (word processing, spreadsheet, etc.), browser programs, and the like. Mobile computing device 400 also includes ROM 432. ROM 432 may be used to store data that should not be lost when mobile device 400 loses power.

Mobile device 400 also comprises input/output interface 424 for communicating with external devices, such as a headset, or other input or output devices not shown in FIG. 4. Data storage 436 is utilized by mobile device 400 to store, among other things, application programs, databases, and program data.

Keypad 458 may be any input device arranged to receive inputs from a user. For example, keypad 458 may include separate push buttons or a keyboard. Display 456 may be a liquid crystal display, or any other type of display commonly used in mobile devices. Display 456 may also be a touch screen arranged to receive a user's inputs. Infrared input/output 460 may be used to send and receive infrared commands. GPS interface 462 may be used in a manner consistent with determining positional information from satellite communications and/or triangulation of wireless communications.

Power supply 426 provides power to mobile device 400. According to one embodiment, a rechargeable battery provides power. The power may be also be provided by an external power source, such as an AC adapter or a powered docking cradle that supplements or recharges the battery.

As shown, mobile device 400 includes light emitting diode (LED) display 450, tuner(s) 452, and audio interface 454. LED display 450 may be controlled to remain active for specific periods or events. For example, an LED display may stay on while the phone is powered or may light up in various patterns. The patterns may be a predetermined or random pattern. Audio interface 454 is arranged to receive and provide audio signals. For example, audio interface 454 may be coupled to a speaker (not shown) to provide audio from a telephone call, tuner(s) 452, or from some other audio source. Audio interface 454 may also be coupled to an input device, such as a microphone, to receive audio input. Tuner(s) 452 may be any tuner to receive a broadcast. For example, tuner(s) 452 may be an AM tuner, an FM tuner, an AM/FM tuner, an Internet radio tuner, a television tuner, and the like.

Figure 5:
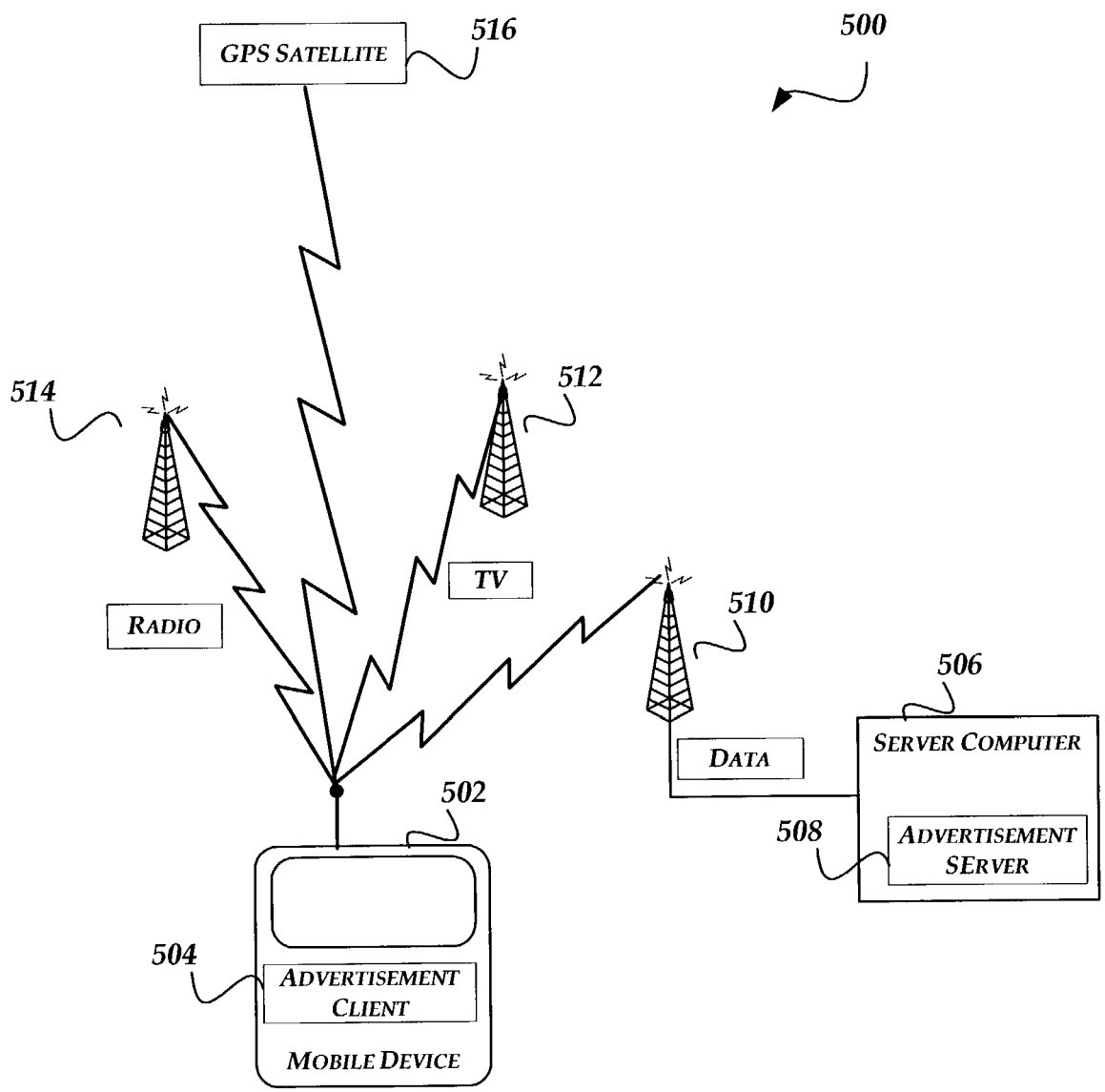
FIG. 5 illustrates a schematic diagram of an exemplary embodiment of a mobile media player that is operative to play streamed content and broadcasts and receive advertisements for playback at predetermined intervals.

FIG. 5 is a functional block diagram generally illustrating an overview of system 500 for inserting advertisements provided by advertisement server 506 into streamed or broadcast content playing on mobile device 502. In this implementation, server computer 506 is a stationary computing device such as the one described above in conjunction with FIG. 3, and mobile device 502 is a mobile computing device such as the one described above in conjunction with FIG. 4. Mobile device 504 is in communication with several different wireless sources of data, information and content, including, but not limited to, radio 514, television 512, data 510 and GPS satellite 516.

Advertisement client 504 is located on mobile device 502 and determines the information about the user for that particular mobile device and provides this information to advertisement server 508 located on server computer 506. The user's information may include any combination of physical location, preference, user behavior and demographic information. The user's information can be asynchronously provided to advertisement server 508 or in real time.

Although not shown, multiple clients on mobile devices can also be in communication with the advertisement server. Furthermore, in one embodiment, a peer-to-peer architecture may be employed where each advertisement application located on a mobile device is in communication with each other and the advertisers. Additionally, an advertisement may be communicated between the mobile device and the server computer using the SMS protocol or some other suitable messaging protocol.

Figure 6:
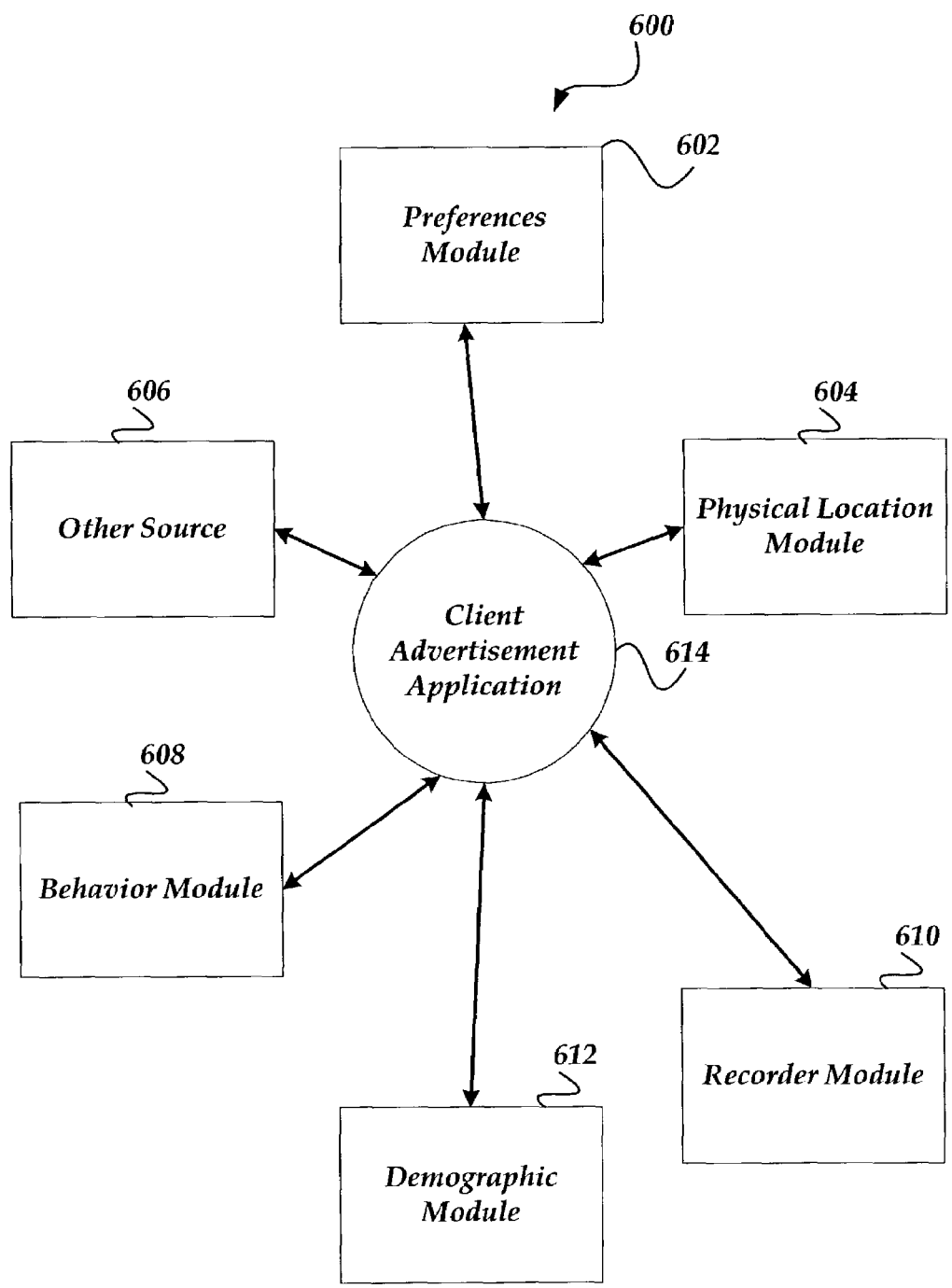
FIG. 6 shows a functional block diagram that generally illustrates one embodiment of a client advertisement application for a mobile device.

FIG. 6 illustrates a functional block diagram for an exemplary client advertisement application 614, which is operative to function as a client in a client-server architecture and where clients are on mobile devices and a server is remotely located for determining advertisements to be played on the mobile devices.

Client advertisement application 614 is in communication with several other modules that provide different types of information, which in total are employed to generate information regarding a user of the mobile device. Preference module 602 enables manual entry through a user interface of preferences for a user. The user may enter any information desired to specify likes, dislikes, memberships, affiliations, and the like. The preference information may be selected from a list of predetermined favorites or expressly entered at the mobile device.

Physical location module 604 enables coordinates identifying the physical location of the user's mobile device to be provided. For example, GPS, Assisted GPS and/or triangulation of wireless signals may be analyzed by physical location module 604 to determine the physical location of the user's mobile device, e.g., at a sports stadium, theatre, restaurant, home, school, and the like.

Recorder module 610 enables an advertisement to be recorded and stored prior to playing on the mobile device. Also, recorder module 610 may be used to record content while an advertisement is playing and subsequently resuming the playing of the content from the point where the advertisement started playing. The content may include, but not limited to, streamed visual content, streamed audio content and broadcast content from a radio station and a television channel.

Demographic module 612 enables the demographics of a user to be determined. For example, a user's age, income and spending habits may be manually entered by the user or determined by the user's answers to various questionnaires or surveys presented by demographic module 612.

Behavior module 608 enables the user's behavior in using the mobile device to be determined such as, but not limited to, playing video games, listening to radio station, viewing television channels, participating in chat rooms, and communicating SMS messages. The type and frequency of behaviors can be determined by behavior module 608. Additionally, other source module 606 enables other sources to be used to provide information regarding the user, e.g., a message from another user of another mobile device that identifies characteristics of the current user of the mobile device. Also, information can be provided by others (or the actual user) from a remotely located stationary computing device about the mobile device user.

Figure 7:
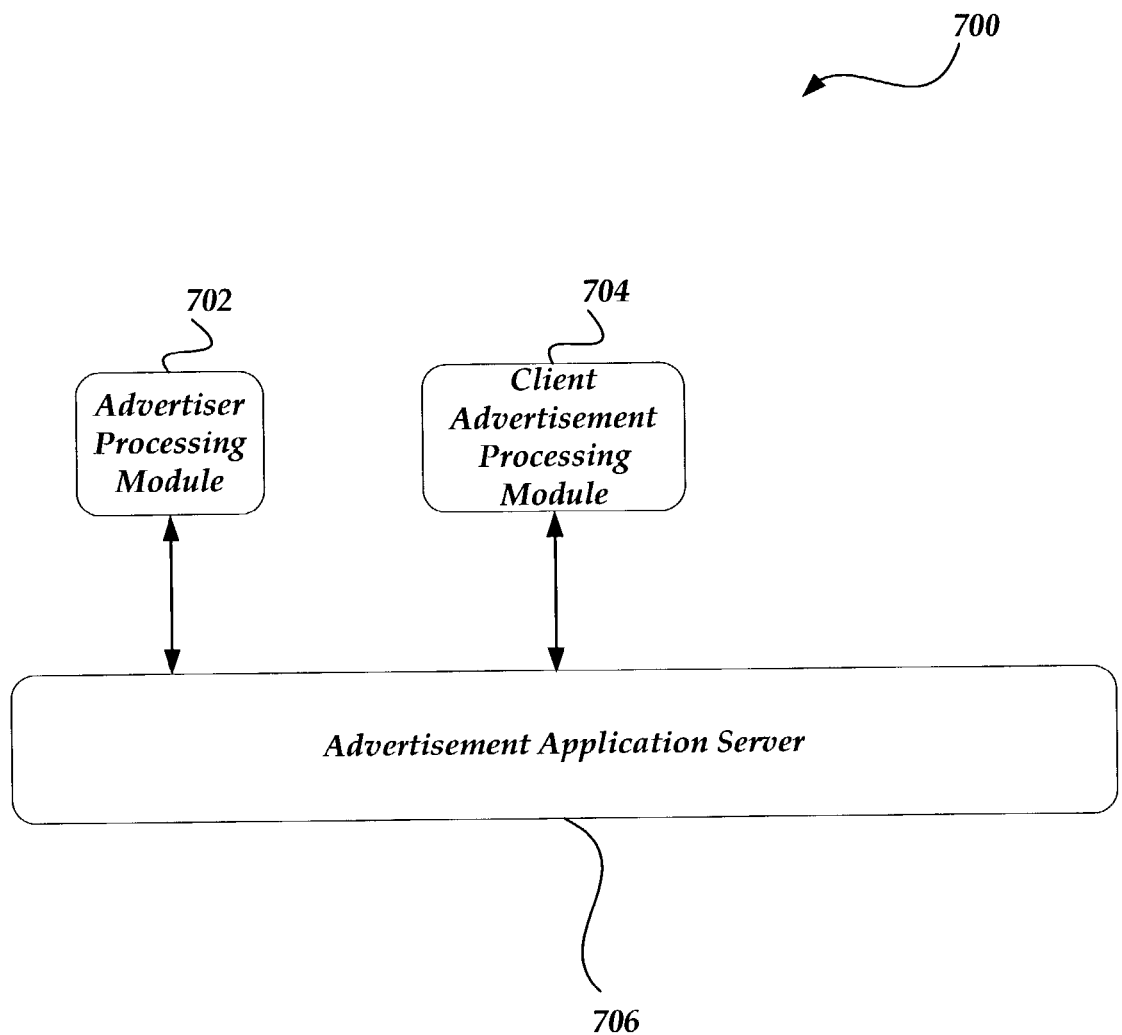
FIG. 7 illustrates a functional block diagram for an advertisement application server.

FIG. 7 illustrates a functional block diagram 700 for exemplary advertisement application server 706, which is operative to function as a server in a client-server architecture, where clients are on mobile devices and the server is remotely located for processing of determined advertisements based on user information. Client advertisement processing module 704 is employed to receive user information from each client and communicate specifically determined advertisements to each client.

Advertiser processing module 702 is employed to receive advertisements from various advertisers that are intended for users of mobile devices. At least some of the provided advertisements are associated with weights. These weights enable advertisement application server 706 to select advertisements for particular users of mobile devices that are most likely to be interested in the subsequent playing of the selected advertisements on their mobile devices. Other advertisements may be associated with specific user information, such as age, type of content played and location.

Figure 8:
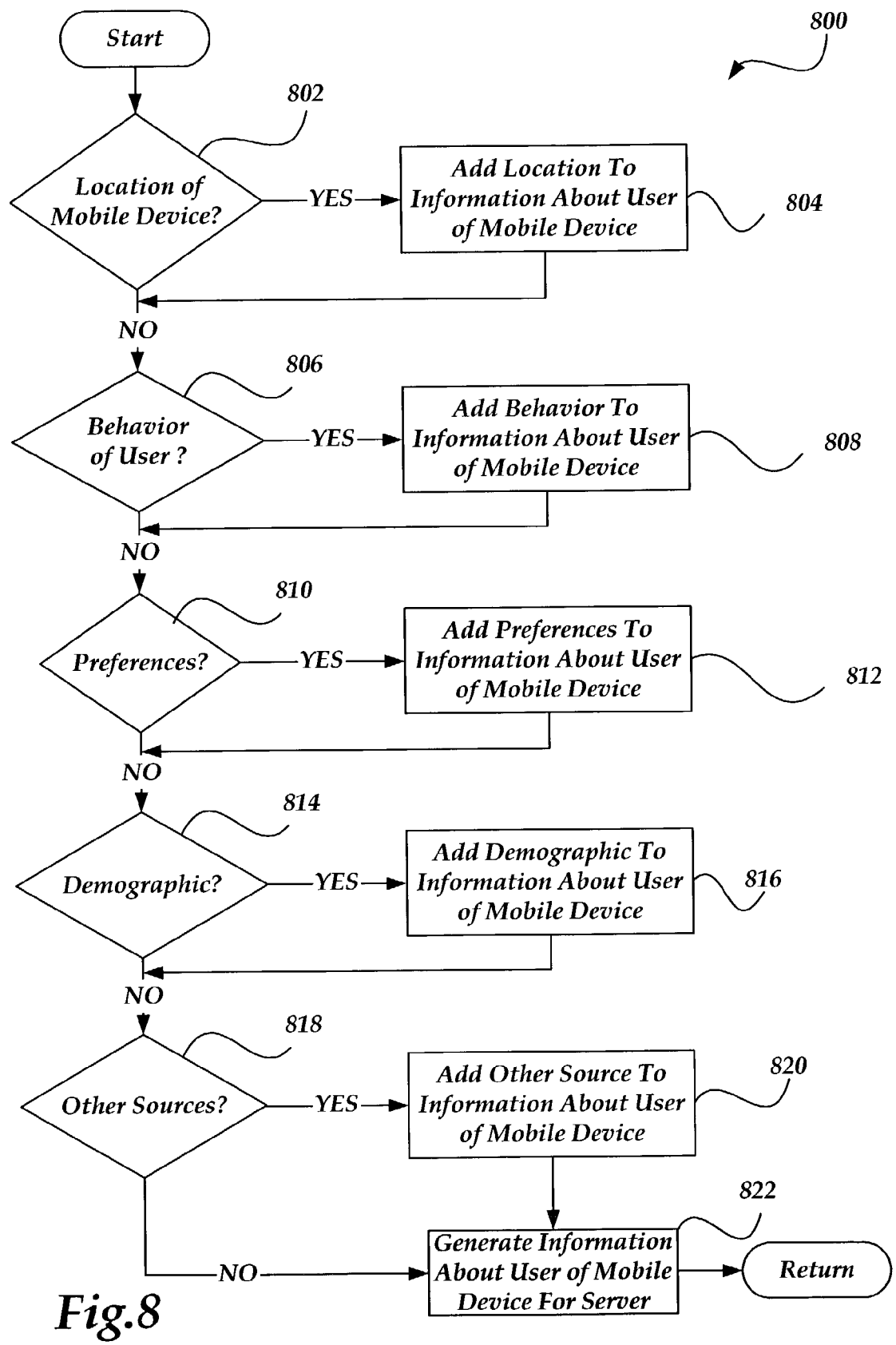
FIG. 8 shows a flow chart that shows the actions for generating information regarding the user of a mobile device.

FIG. 8 is a flow chart that illustrates an overview 800 of the process for generating information regarding the user of a mobile device. Moving from a start block, the process advances to decision block 802 where a determination is made if the location of the mobile device is available. If true, the process advances to block 804 where the location is added to information about the user of the mobile device. The location may be manually entered by the user and/or provided from a GPS, assisted GPS, wireless signal triangulation, and the like, to determine the location of the user of the mobile device. Next, the process flows to decision block 806 where a determination is made as to whether the behavior of the user is provided. Also, when the determination at decision block 802 is false, the process steps directly to decision block 806.

At decision block 806, when the process determines that at least one behavior of the user is available, it moves to block 808 where behavior information is added to other information about the mobile device user. The process steps to decision block 810 where a determination is made as to whether user preferences are provided. Alternatively, when the determination at decision block 806 is negative, the process advances to decision block 810.

At decision block 810, when the process determines that at least one user preference is provided, it moves to block 812 where user preferences are added to other information about the user of the mobile device. Next, the process flows to decision block 814 where a determination is made as to whether at least one demographic piece of information regarding the user is provided. If true, the process steps to block 816 where the demographic information is added to other information regarding the mobile device user. Next, the process steps to decision block 818 where a determination is made as to whether other sources have provided information regarding the mobile device user. Also, when the determination at decision block 814 is false, the process moves directly to decision block 818.

At decision block 818, when the determination is true, the process advances to block 820 where the other source information is added to other information regarding the mobile device user. Next, the process flows to block 822 where information regarding the mobile device user is generated that can be subsequently used in determining advertisements to be played by the user's mobile device. Alternatively, when other source information is not provided at decision block 818, the process steps directly to block 822 and performs substantially the same actions discussed above. In either case, the process moves from block 822 and returns to processing other actions.

Figure 9:
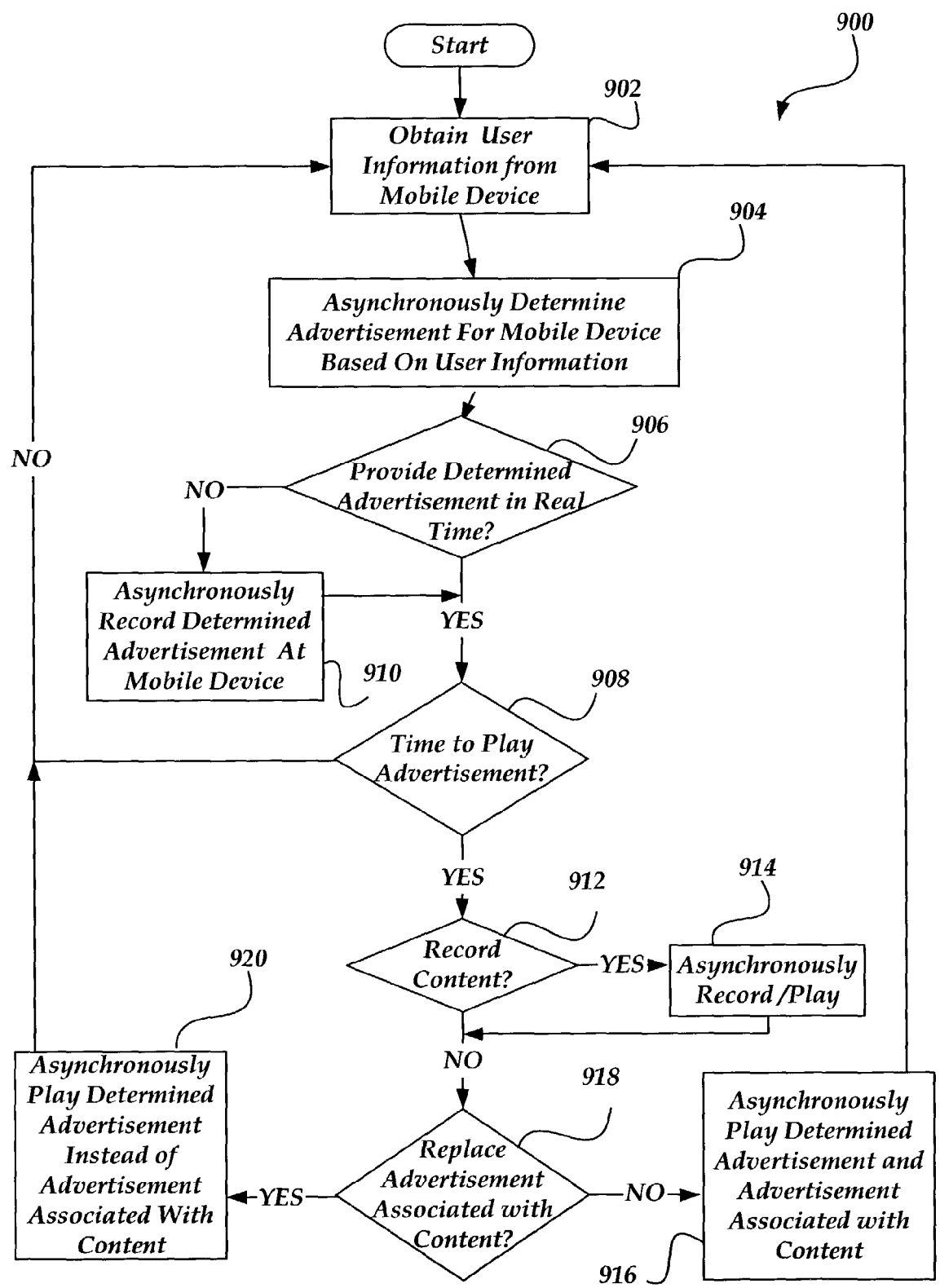
FIG. 9 illustrates a flow chart that shows the actions for playing determined advertisements on a mobile device in accordance with the present invention.

FIG. 9 is a flow chart that illustrates an overview 900 of the process for playing advertisements that are determined to be related to information provided about the user of a mobile device. Moving from a start block, the process steps to block 902 where information about the user of the mobile device is provided. This process is expressed in the discussion accompanying FIG. 8 and other parts of the specification above. The process flows to block 904 where the provided mobile device user's information is asynchronously employed to determine at least one advertisement that could be of interest to the user of the mobile device.

Next, the process advances to decision block 906 where a determination is made as to whether the determined advertisement is to be provided in real time (during a time interval scheduled for the playing of advertisements). If not, the process moves to block 910 where the determined advertisement is recorded on the mobile device for later playback. Next, the process steps to decision block 908 where a determination is made as to whether it is a scheduled time to play the determined advertisement. Alternatively, if the determination at decision block 906 is affirmative, the process flows directly to decision block 908.

At decision block 908, if the determination is negative, the process loops back to block 902 and continues performing substantially the same actions discussed above. However, when the process determines at decision block 908 that it is time to play the determined advertisement, it flows to decision block 910 where a determination is made whether to record the content while the determined advertisement is playing. If false, the process moves to block 914 where the playing content will be recorded while the determined advertisement is playing. Also, when the determined advertisement is done playing, the process will automatically resume playing the content from the point that the determined advertisement started playing.

Next, the process moves to block 918 where another determination is made as to whether to replace the playing of at least one advertisement associated with and/or included with the currently playing content. If false, the process moves to block 916 where the determined advertisement is asychnronously played along with the advertisement associated with the content during a scheduled time interval. The process then loops back to block 902 and performs substantially the same actions as discussed above.

However, when the determination at decision block 918 is affirmative, the process moves to block 920 where the determined advertisement is played as a substitute for the advertisement associated/included with the currently playing content. Next, the process returns to block 902 and continues performing substantially the same actions as discussed above.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for playing content and advertisements on a cellular device, comprising:
  (a) autonomously providing to a server, by the cellular device, information associated with a user of the cellular device, the information taken by the cellular device from a message sent to the cellular device from another user of another cellular device, the message identifying characteristics of the user of the cellular device;
  (b) receiving from the server, by the cellular device, at least one advertisement to be played on the cellular device, wherein the at least one received advertisement is determined by the server based at least in part on the provided information;
  (c) if a determined time interval occurs, stopping playing of content, by the cellular device, and playing at least one of the determined advertisements, by the cellular device, the playing of the at least one determined advertisement comprising:
    recording, by the cellular device, the content which playing was stopped, while the at least one determined advertisement is playing; and
    when the playing of the at least one determined advertisement is completed, resuming the playing of the stopped content, by the cellular device, from where the stopping of the playing of the content occurred, using the recorded content.

2. The method of claim 1, wherein the provided information additionally includes at least one of the group consisting of a preference of a user of the cellular device, a demographic data of the cellular device, content played on the cellular device, or a geographic location of the cellular device.

3. The method of claim 2 wherein the provided information additionally includes at least one selected from the group consisting of a game played on the cellular device, a radio station broadcast received by the cellular device, or a television station broadcast received by the cellular device.

4. The method of claim 1, wherein the playing of at least one determined advertisement further comprises:
  (a) receiving from the server, by the cellular device, the at least one determined advertisement prior to the playing of the at least one determined advertisement; and
  (b) recording, by the cellular device, at least one of the at least one determined advertisement on the cellular device for play back when the determined time interval occurs.

5. The method of claim 1, further comprising employing the cellular device to receive the content as a stream of content.

6. The method of claim 1, further comprising receiving the content as a broadcast of content for playing on the cellular device.

7. The method of claim 1, further comprising employing the cellular device to receive a stream for the at least one determined advertisement.

8. The method of claim 1, further comprising receiving a broadcast of the at least one determined advertisement for playing on the cellular device.

9. A cellular device, comprising:
   (a) a memory for storing logical instructions;
   (b) a wireless interface unit for sending and receiving data; and
   (c) a processor for executing the logical instructions stored in the memory, the execution of the logical instructions causing actions to be performed, including:
      (i) autonomously providing to a server information associated with a user of the cellular device, the information taken by the cellular device from a message sent to the cellular device from another user of another cellular device, the message identifying characteristics of the user of the cellular device;
      (ii) receiving from the server at least one advertisement, wherein the at least one received advertisement is determined by the server based at least in part on the provided information;
      (iii) if a determined time interval occurs, stopping playing of content, and playing the at least one determined advertisement, the playing of the at least one determined advertisement comprising:
         recording the content which playing was stopped while the at least one determined advertisement is playing; and
         when the playing of the at least one determined advertisement is completed, resuming the playing of the stopped content from where the stopping of the playing of the content occurred, using the recorded content.

10. The cellular device of claim 9, wherein the provided information additionally includes at least one from the group consisting of a user preference of the cellular device, a user demographic of the cellular device, a user behavior of the cellular device, content played on the cellular device, or a geographic location of the cellular device.

11. The cellular device of claim 9, wherein the playing of at least one determined advertisement further comprises:
   (a) receiving from the server the at least one determined advertisement prior to the playing of the at least one determined advertisement; and
   (b) recording the at least one determined advertisement on the cellular device for play back if the determined interval occurs.

12. An article of manufacture comprising:
a storage medium; and
a plurality of programming instructions stored on the storage medium and adapted to instantiate a client for playing content and advertisements on cellular devices, the client configured to cause actions to be performed, the actions including
   (a) autonomously providing to a sewer information associated with a user of a cellular device, the information taken by the cellular device from a message sent to the cellular device from another user of another cellular device, the message identifying characteristics of the cellular device,
   (b) receiving from the server at least one advertisement, wherein the at least one received advertisement is determined by the sewer based at least in part on the provided information,
   (c) if a determined time interval occurs, stopping playing of the content on the cellular device and playing the at least one determined advertisement, the playing of the at least one determined advertisement including:
      recording the content which playing was stopped while the at least one determined advertisement is playing, and
      when the playing of the at least one determined advertisement is completed, resuming the playing of the stopped content from where the stopping of the playing of the content occurred, using the recorded content.

13. The article of claim 12, wherein the provided information additionally includes at least one from the group consisting of a user preference of the cellular device, a user demographic of the cellular device, a user behavior of the cellular device, content played on the cellular device, or a geographic location of the cellular device.

14. An article of manufacture comprising:
a storage medium; and
a plurality of programming instructions stored on the storage medium and adapted to instantiate a server for providing content and advertisements to cellular devices, the server configured to cause actions to be performed, the actions including
   (a) receiving information associated with a user of a cellular device from the cellular device, independent of user input, the information taken by the cellular device from a message sent to the cellular device from another user of another cellular device, the message identifying characteristics of the user of cellular device,
   (b) employing the received information to determine at least one advertisement to be played on the cellular device, and
   (c) providing the at least one determined advertisement to the cellular device, wherein if a determined time interval occurs, playing of the content by the cellular device is stopped and the at least one determined advertisement is played on the cellular device, the playing of the at least one determined advertisement including:
      recording the content which the playing was stopped while the at least one determined advertisement is playing, and
      when the playing of the at least one determined advertisement is completed, resuming the playing of the stopped content from where the stopping of the playing of the content occurred, using the recorded content.

* * * * *

UNITED STATES PATENT AND TRADEMARK OFFICE
CERTIFICATE OF CORRECTION

PATENT NO. : 7,376,414 B2 Page 1 of 1
APPLICATION NO. : 10/143342
DATED : May 20, 2008
INVENTOR(S) : G. Eric Engstrom It is certified that error appears in the above-identified patent and that said Letters Patent is hereby corrected as shown below:

Column 13, lines 60-61, "sewer information" should read --server information--.

Column 14, line 7, "sewer based" should read --server based--.

Signed and Sealed this

Seventh Day of October, 2008

JON W. DUDAS
*Director of the United States Patent and Trademark Office*